United States Patent
Chan et al.

(10) Patent No.: US 7,241,674 B2
(45) Date of Patent: Jul. 10, 2007

(54) METHOD OF FORMING SILICIDED GATE STRUCTURE

(75) Inventors: Bor-Wen Chan, Hsin-chu (TW); Jyu-Horng Shieh, Hsin-chun (TW); Hun-Jan Tao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 215 days.

(21) Appl. No.: 10/846,278

(22) Filed: May 13, 2004

(65) Prior Publication Data

US 2005/0253204 A1    Nov. 17, 2005

(51) Int. Cl.
*H01L 21/3205* (2006.01)
*H01L 21/336* (2006.01)

(52) U.S. Cl. .................. 438/592; 438/299; 438/301; 438/303

(58) Field of Classification Search ........ 438/682–683, 438/592, 299, 301, 303
See application file for complete search history.

(56) References Cited

U.S. PATENT DOCUMENTS

| 5,100,820 | A | 3/1992 | Tsubone |
| 5,624,869 | A | 4/1997 | Agnello et al. |
| 5,645,887 | A | 7/1997 | Byun |
| 5,739,563 | A | 4/1998 | Kawakubo et al. |
| 5,780,362 | A | 7/1998 | Wang et al. |
| 5,780,896 | A | 7/1998 | Ono |
| 5,937,299 | A | 8/1999 | Michael et al. |
| 6,008,124 | A | 12/1999 | Sekiguchi et al. |
| 6,015,748 | A * | 1/2000 | Kim et al. .................. 438/592 |
| 6,143,617 | A | 11/2000 | Shue et al. |
| 6,159,781 | A | 12/2000 | Pan et al. |
| 6,197,645 | B1 | 3/2001 | Michael et al. |
| 6,201,303 | B1 | 3/2001 | Ngo et al. |
| 6,204,133 | B1 | 3/2001 | Yu et al. |
| 6,204,177 | B1 | 3/2001 | Besser et al. |
| 6,214,680 | B1 | 4/2001 | Quek et al. |
| 6,225,216 | B1 | 5/2001 | Ngo et al. |

(Continued)

FOREIGN PATENT DOCUMENTS

WO    PCT/JP95/00592    3/1995

OTHER PUBLICATIONS

Tavel et al., "Totally Silicided (CoSi2) Polysilicon: a novel approach to very low-resistive gate (2 / ) without metal CMP nor etching", 2001 IEEE, pp. 37.5.1-37.5.4.

(Continued)

*Primary Examiner*—Thanh T. Nguyen
(74) *Attorney, Agent, or Firm*—Duane Morris LLP

(57) ABSTRACT

A method of forming a silicided gate on a substrate having active regions is provided. The method comprises forming silicide in the active regions and a portion of the gate, leaving a remaining portion of the gate unsilicided; forming a shielding layer over the active regions and gate after the forming step; forming a coating layer over portions of the shielding layer over the active regions; opening the shielding layer to expose the gate, wherein the coating layer protects the portions of the shielding layer over the active regions during the opening step; depositing a metal layer over the exposed gate; and annealing to cause the metal to react with the gate to silicidize at least a part of the remaining portion of the gate.

18 Claims, 6 Drawing Sheets

U.S. PATENT DOCUMENTS

| | | | |
|---|---|---|---|
| 6,228,761 | B1 | 5/2001 | Ngo et al. |
| 6,232,224 | B1 | 5/2001 | Inoue et al. |
| 6,236,091 | B1 | 5/2001 | Ngo et al. |
| 6,249,010 | B1 | 6/2001 | Bergemont et al. |
| 6,268,257 | B1 | 7/2001 | Wieczorek et al. |
| 6,284,664 | B1 | 9/2001 | Kawai |
| 6,320,213 | B1 | 11/2001 | Kirlin et al. |
| 6,326,270 | B1 | 12/2001 | Lee et al. |
| 6,326,290 | B1 | 12/2001 | Chiu |
| 6,350,636 | B1 | 2/2002 | Lee et al. |
| 6,350,688 | B1 | 2/2002 | Liu et al. |
| 6,351,016 | B1 | 2/2002 | Huang et al. |
| 6,362,023 | B1 | 3/2002 | Bergemont |
| 6,362,086 | B2 | 3/2002 | Weimer et al. |
| 6,380,014 | B1 | 4/2002 | Ohta et al. |
| 6,380,578 | B1 | 4/2002 | Kunikiyo |
| 6,444,578 | B1 | 9/2002 | Cabral, Jr. et al. |
| 6,465,309 | B1 | 10/2002 | Xiang et al. |
| 6,475,908 | B1 | 11/2002 | Lin et al. |
| 6,514,859 | B1 | 2/2003 | Erhardt et al. |
| 6,524,916 | B1 | 2/2003 | Scholer et al. |
| 6,562,718 | B1 * | 5/2003 | Xiang et al. ............ 438/682 |
| 6,576,548 | B1 | 6/2003 | Tu et al. |
| 6,602,434 | B1 | 8/2003 | Hung et al. |
| 6,602,781 | B1 | 8/2003 | Xiang et al. |
| 6,630,712 | B2 | 10/2003 | Yu |
| 6,689,688 | B2 | 2/2004 | Besser et al. |
| 6,846,734 | B2 | 1/2005 | Amos et al. |
| 2002/0019119 | A1 | 2/2002 | Saigal et al. |
| 2002/0064918 | A1 | 5/2002 | Lee et al. |
| 2002/0081794 | A1 | 6/2002 | Ito |

OTHER PUBLICATIONS

Polishchuk et al., "Dual Work Function Metal Gate CMOS Technology Using Metal Interdiffusion", 2001 IEEE, pp. 444-446.

Lu et al., "Metal Gate Work Function Adjustment for Future CMOS Technology", 2001 Symposium on VLSI Technology digest of Technical Papers, pp. 45-46.

Yeo et al., "Effects of High-k Dielectrics on the Workfunctions of Metal and Silicon Gates", 2001 Symposium on VLSI Technology Digest of Technical Papers, pp. 49-50.

Matsuo et al., "Damascene Metal Gate MOSFETs with Co Silicided Source/Drain and High-k Gate Dielectrics," 2000 Symposium on VLSI Technology Digest of Technical Papers, pp. 70-71.

Krivokapic et al., "Nickel Silicide Metal Gate FDSOI Devices with Improved Gate Oxide Leakage", 2002 IEEE, pp. 271-273.

Lee et al., "Tunable Work Function Dual Metal Gate Technology for Bulk and Non-Bulk CMOS", 2002 IEEE, pp. 359-362.

Choi et al., "FinFET Process Refinements for Improved Mobility and Gate Work Function Engineering", 2002 IEEE, pp. 259-262.

Ranade et al., "Tunable Work Function Molybdenum Gate Technology for FDSOI-CMOS", 2002 IEEE, pp. 363-366.

* cited by examiner

METHOD OF FORMING SILICIDED GATE STRUCTURE

FIELD OF THE INVENTION

The present invention relates to semiconductor fabrication and more particularly to methods of forming field effect transistors having silicided regions.

BACKGROUND OF THE INVENTION

The principle way of reducing contact resistance between polysilicon gates and source/drain regions and interconnect lines is by forming a metal silicide atop the source/drain regions and the gate electrodes prior to application of the conductive film for formation of the various conductive interconnect lines. Presently, the most common metal silicide materials are $CoSi_2$ and $TiSi_2$, typically formed by the so called salicide (self-aligned silicide) process. In the salicide process, a thin layer of a metal, such as titanium, is blanket deposited over the semiconductor substrate, specifically over exposed source/drain and gate electrode regions. The wafer is then subjected to one or more annealing steps, for example at a temperature of 800° C. or higher for titanium. This annealing process causes the metal to selectively react with the exposed silicon of the source/drain regions and the gate electrodes, thereby forming a metal silicide (e.g., $TiSi_2$). The process is referred to as the self-aligned silicide process because the silicide layer is formed only where the metal material directly contacts the silicon source/drain regions and the polycrystalline silicon (polysilicon) gate electrode. Following the formation of the silicide layer, the unreacted metal is removed and an interconnect process is performed to provide conductive paths, such as by forming via holes through a deposited interlayer dielectric and filling the via holes with a conductive material, e.g., tungsten.

The thickness of the silicide layer is an important parameter because a thin silicide layer is more resistive than a thicker silicide layer of the same material. Therefore, a thicker silicide layer increases semiconductor speed. The formation of a thick silicide layer, however, may cause a high junction leakage current in the active regions and low reliability, particularly when forming ultra-shallow junctions. The formation of a thick silicide layer consumes silicon from the underlying semiconductor substrate such that the thick silicide layer approaches and even shorts the ultra-shallow junction, thereby generating a high junction leakage current.

It is desirable to also lower the resistance of the gate electrode to increase the speed of the device. The greater the amount of silicon converted into silicide in the gate electrode, the lower the resistance will be in the gate electrode. Silicided gate electrodes also eliminate problems associated with boron penetration from the polysilicon gate electrode into the gate oxide of PMOS devices and avoid device performance degradation due to the depletion effect. Formation of silicide in the gate electrode simultaneously with the source/drain regions leads to the risk of spiking in the source/drain regions if the complete silicidation of the gate electrode is attempted. The conventional salicide process, therefore, suffers from a very narrow process window due to the strong likelihood that exposure of the metal and silicon to rapid thermal annealing conditions sufficient to completely silicidize a gate electrode will also cause the silicide in the source/drain region to spike and reach the bottom of the junction, undesirably causing leakage.

Various methods have been suggested for forming fully silicided gate electrodes. U.S. Pat. No. 6,562,718 to Xiang et al. describes a method of forming a fully silicided gate electrode. Xiang et al. propose simultaneously forming a silicide region in the source/drain regions and partially within the gate electrode. A silicon oxide shielding layer is then deposited over the substrate and opened by chemical mechanical polishing (CMP) to expose the gate electrode, leaving the source/drain regions covered by the remaining portion of the shielding layer. Silicidation of the gate electrode is then completed. The Xiang et al. process suffers from several problems. The CMP step adds significant process costs to the fabrication method. Further, the CMP step adversely effects process control. Specifically, the CMP step is not highly selective between the oxide shielding layer and the polysilicon gate. Therefore, the height of the polysilicon gate cannot be controlled effectively using the process of Xiang et al.

There remains a need for a method of forming fully silicided gate electrodes that affords greater process control.

SUMMARY OF THE INVENTION

A method of forming a silicided gate on a substrate having active regions is provided. The method comprises forming silicide in the active regions and a portion of the gate, leaving a remaining portion of the gate unsilicided; forming a shielding layer over the active regions and gate after the forming step; forming a coating layer over portions of the shielding layer over the active regions; opening the shielding layer to expose the gate, wherein the coating layer protects the portions of the shielding layer over the active regions during the opening step; depositing a metal layer over the exposed gate; and annealing to cause the metal to react with the gate to silicidize at least a part of the remaining portion of the gate.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

The method steps described below do not form a complete process flow for manufacturing integrated circuits. The present embodiments can be practiced in conjunction with integrated circuit fabrication techniques currently used or known in the art or later developed, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments.

Figure 1:
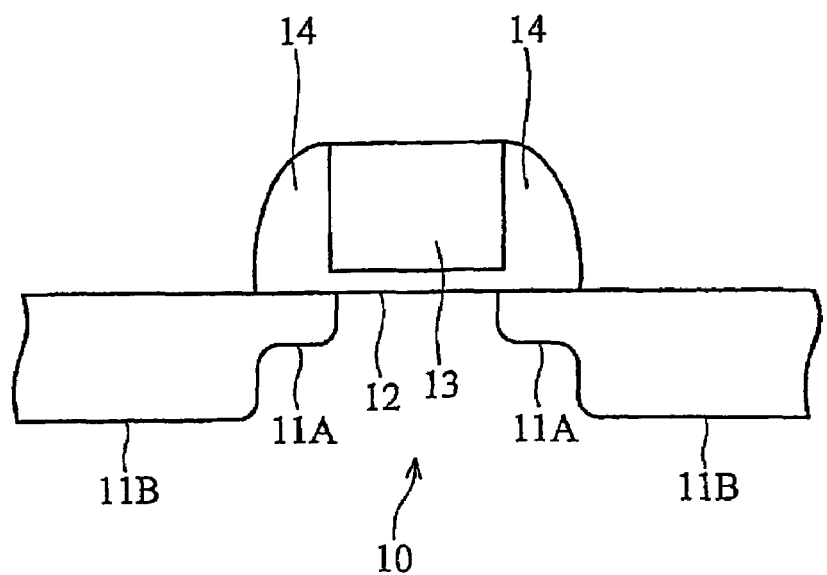
FIGS. 1–11 schematically illustrate sequential phases of forming a fully silicided gate in accordance with an embodiment of the present invention.

Sequential steps of an exemplary embodiment of a method of forming silicide regions in a semiconductor substrate, specifically a fully silicided gate, are described below with respect to the schematic illustrations of FIGS. 1–11. Similar reference numerals denote similar features. Referring first to FIG. 1, a conventional transistor structure is provided comprising a substrate 10 doped with either an N-type impurity or P-type impurity and source/drain regions 11 comprising shallow extension regions 11A and heavily doped regions 11B doped with either a P-type impurity or an N-type impurity. In an exemplary embodiment, the substrate comprises crystalline silicon, e.g., monocrystaline silicon. The substrate 10 can be, for example, silicon-germanium substrate, III-V compound substrate, silicon on insulator (SOI) substrate or other substrate. As is common, the source/drain regions 11 have a conductivity opposite to that of the substrate. The source/drain regions 11 are formed by forming gate electrode 13 on the substrate 10 with gate dielectric layer 12, e.g., a gate oxide such as silicon dioxide, therebetween. Using the gate electrode 13 as a mask, shallow extension regions 11A are formed. Dielectric sidewall spacers 14 are then formed on the side surfaces of the gate electrode 13. Dielectric sidewall spacers may comprise any suitable dielectric material, such as silicon dioxide, silicon nitride, or a composite of silicon dioxide and silicon nitride. Ion implantation is then conducted, using the gate electrode 13 and sidewall spacers 14 as a mask to form heavily doped regions 11B.

Figure 2:
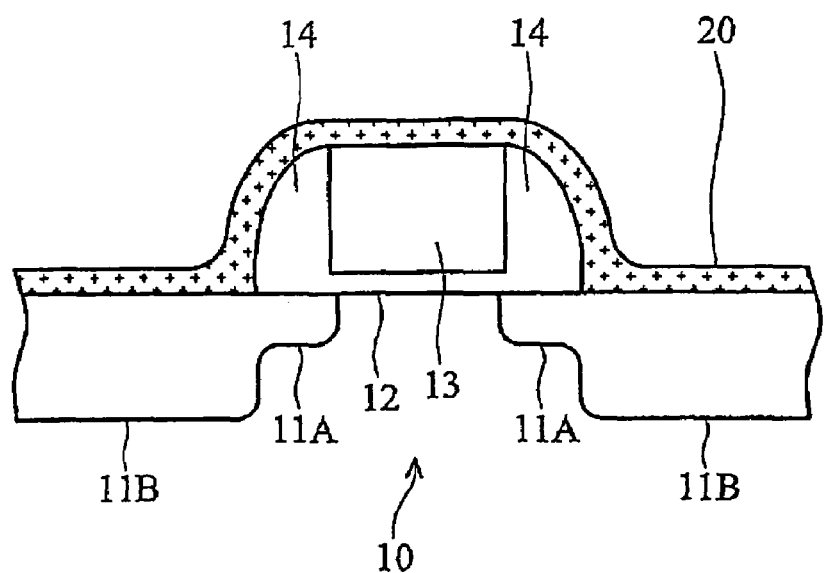

Referring to FIG. 2, metal layer 20, such as nickel, is blanket deposited over at least the exposed portions of the active source/drain regions 11, i.e., on the heavily doped regions 11B, and, in one embodiment, on the upper surface of the gate electrode 13, which may comprise polycrystalline silicon or amorphous silicon. In one embodiment, the gate electrode has a height between about 500–2800 Å, more preferably 1000–2000 Å. The metal layer 20 can be deposited in any manner, such as by chemical vapor deposition (CVD) or sputtering. An exemplary thickness of metal layer 20 is between about 80–200 Å, which will produce silicide in the substrate 10 to a depth of about 150–400 Å after annealing.

Figure 3:
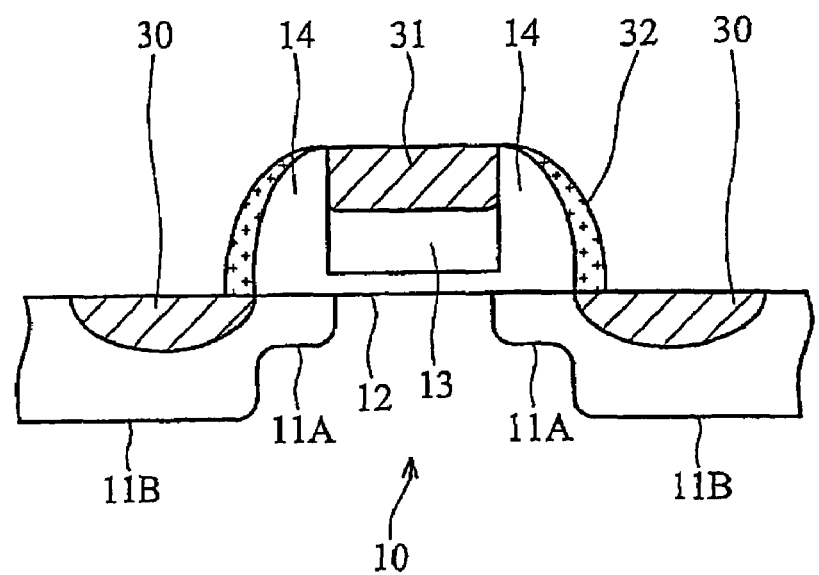

Referring to FIG. 3, an annealing step is performed, typically a rapid thermal annealing (RTA) step. The annealing step may take place at a temperature of about 350° C. to about 700° C. for about 10 to about 90 seconds when nickel is employed as the metal. Other rapid thermal anneal parameters may be used depending on the selected metal and the silicide quantities desired. Upon annealing, metal silicide layers 30, 31, e.g., nickel silicide, form in the source/drain regions 11 and the gate electrode 13, respectively. Preferably, the thickness of the silicide layers 30, 31 in the source/drain regions can be tailored or optimized by controlling the thickness of the deposited nickel layer 20 and the RTA parameters (e.g., temperature and time).

Figure 4:
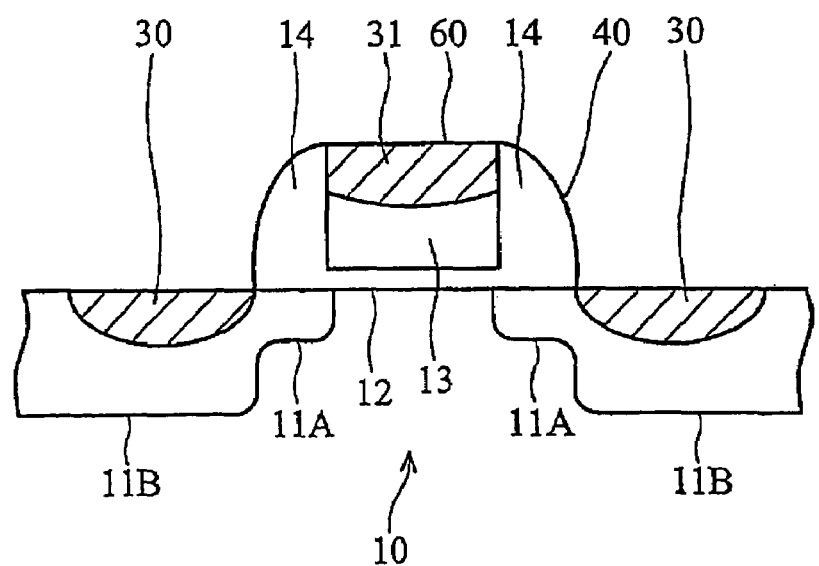

Referring to FIG. 4, any unreacted metal 32 (FIG. 3) is removed from the substrate 10, leaving a clean upper surface 60 on the gate. In one embodiment, the unreacted metal is removed by a wet chemical etch, such as with a sulfuric peroxide mixture $H_2SO_4:H_2O$ (3:1) with deionized $H_2O$ at a temperature of 100° C. The removal rate of nickel at the 3:1 ratio is about 10,000 Å/minute. This exemplary wet chemical etch exhibits high selectivity for the unreacted nickel 32 relative to the nickel silicide layers 30, 31.

Figure 5:
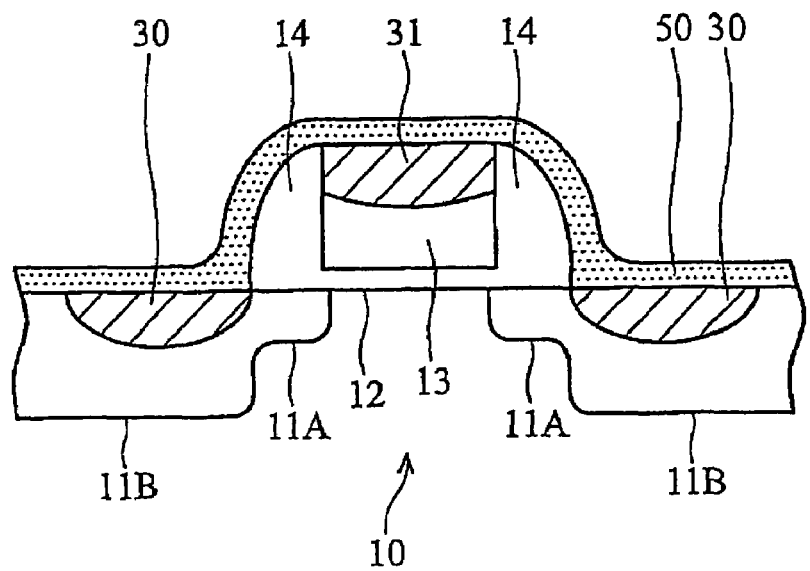

Referring to FIG. 5, a shielding layer 50 is deposited over the semiconductor device. In one embodiment, shielding layer 50 comprises silicon oxide or other material that will not react with the subsequently deposited metal, thereby protecting the silicidized source/drain regions 30 from further silicidation during subsequent completion of the silicidation of the gate. Shielding layer 50 may be formed by chemical vapor deposition, for example. In one embodiment, the layer 50 is formed to a thickness between about 50–500 Å.

Figure 6:
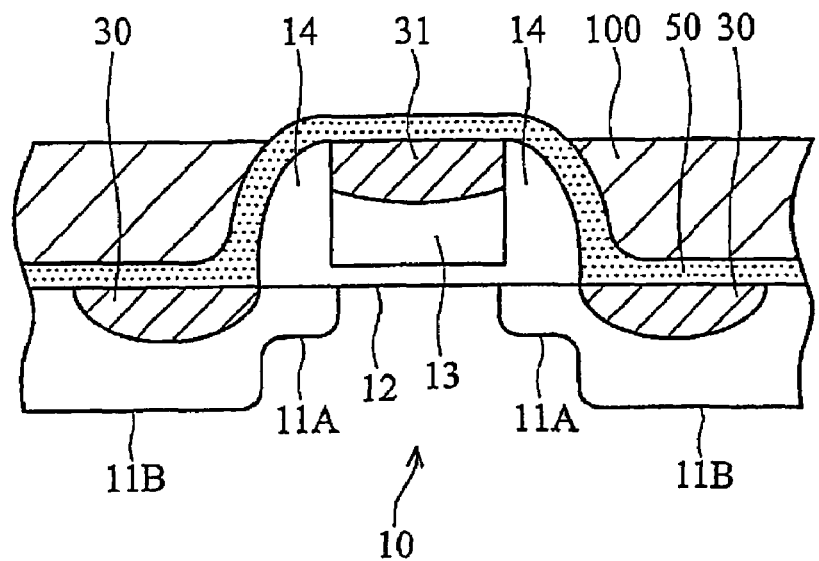

Referring to FIG. 6, a coating layer 100 is formed over the substrate 10 shown. In an exemplary embodiment, the coating layer 100 comprises a polymer, preferably an organic polymer such as a 193 nm or 248 nm photoresist. The coating layer is preferably formed to a thickness so as to not cover the shielding layer 50 in a region over the gate but to be sufficiently thick so as to substantially protect (i.e., prevent etch through) of the shielding layer 50 over silicided regions 30 during opening of the shielding layer 50 over the gate electrode (as described below). In one embodiment, for a gate electrode (i.e., polysilicon regions 13 and silicide regions 31 in FIG. 6) having a thickness between about 300–1500 Å, the coating layer 100 has a thickness between about 300–1500 Å.

Figure 7:
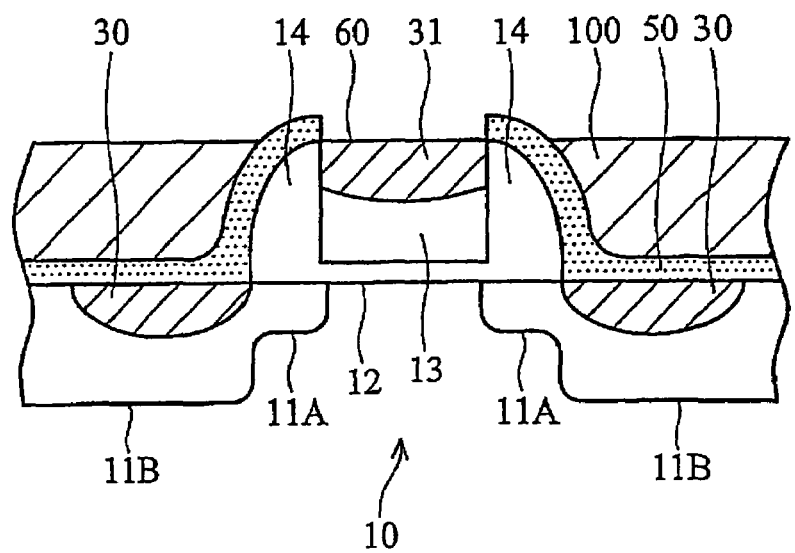
Figure 8:
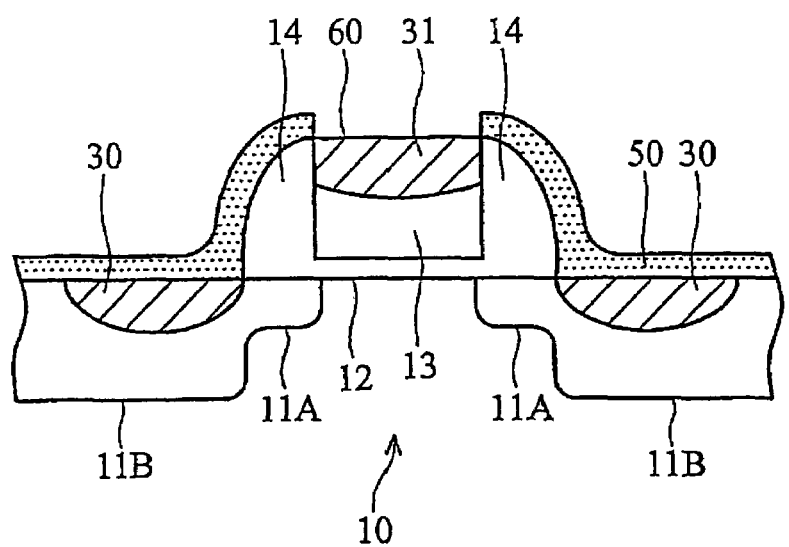

Referring to FIG. 7, an opening in the shielding layer 50 is formed, thereby exposing the top surface 60 of the gate electrode. In one embodiment, the opening is formed through the shielding layer 50 using an etch back process, such as: pressure: 4–500 mTorr; power: 20–1000 W; chemistry: CF based (e.g., $CF_4$ or $CHF_3$ or $CH_2F_2$ or $CH_3F$) at 10–200 sccm, Argon at 10–500 sccm, and $O_2$ at 1–50 sccm. Using an etch process eliminates the need for a chemical mechanical polishing step to expose the gate electrode for further silicidation as well as the cleaning steps that typically follow the CMP process. Excellent alignment can also be achieved using the masks utilized in formation of the gate Referring to FIG. 8, the photoresist layer 100 is then removed to leave the remainder of shielding layer 50, which includes an opening that exposes the top surface 60 of the gate electrode. In one embodiment, the photoresist layer 100 is removed using an oxygen ($O_2$) ashing process. In one embodiment, the flow parameters are as follows: $N_2$ or $N_2H_2$ or $H_2$ at 30–500 sccm and $O_2$ at 100–500 sccm.

Figure 9:
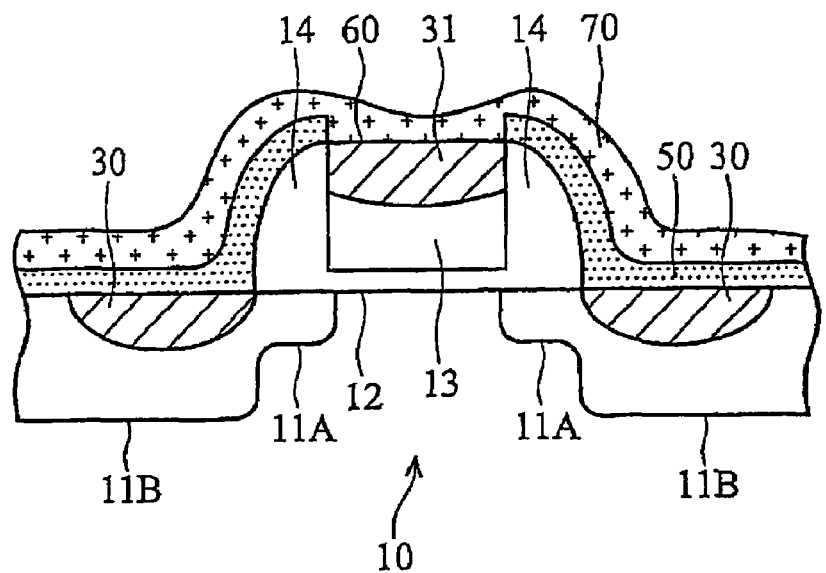

Referring to FIG. 9, a metal layer 70, such as nickel, is then blanket deposited over the semiconductor device including the exposed surface 60 of the gate electrode 13 and the remaining portions of shielding layer 50. The deposited metal layer 70 is deposited to a thickness to, once annealed, silicidize at least a part of the remaining portion of the gate electrode. In a preferred embodiment, the deposited metal layer 70 is at least of sufficient thickness that, once annealed, the layer 70 reacts with the gate electrode to silicidize the remaining portions of the gate electrode, thereby forming a fully silicidized gate. As the ratio of nickel to silicide is about 1:3 or 1:4, for a 1000 Å gate, about 250–400 Å layer of nickel is sufficient to fully silicidize the gate electrode 13 in this embodiment. This thickness may be reduced somewhat, depending on the depth of the initial silicidation 31 in the gate electrode 13 prior to this second silicidation step. Forming the metal layer to a greater thickness, however, ensures a sufficient source of metal for silicidizing the gate electrode 13. Because the gate electrode height can be more easily controlled, compared with exposing the gate electrode by chemical mechanical polishing, the silicidation of the remaining portions of the gate electrode may also be more easily controlled.

Figure 10:
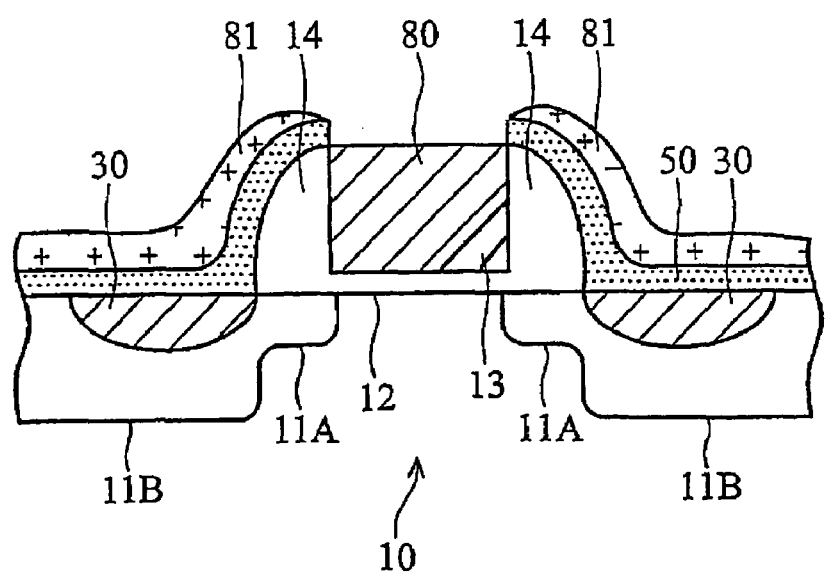

Referring to FIG. 10, a rapid thermal anneal process is again applied to the substrate causing the metal 70 to react with the gate electrode 13. The metal 70 diffuses into the gate electrode 13 to silicidize the remaining portion of the gate, thereby fully silicidizing the gate electrode 13. By "fully silicidize" or "fully silicided" it is meant that the gate electrode is substantially silicided, meaning, in one embodiment, silicide forms in at least 90–100 percentage of the height gate, and more preferably at least 95–100 percentage of the height of the gate. Although nickel has been described as a preferred metal for the embodiments described herein, other metals or alloys that form suicides and are predominant diffusion species may be used, such as Palladium (Pd), Chromium (Cr), Cobalt (Co), Titanium (Ti), etc. Annealing process parameters and metal thickness may change in dependence on the metal 70 selected.

Figure 11:
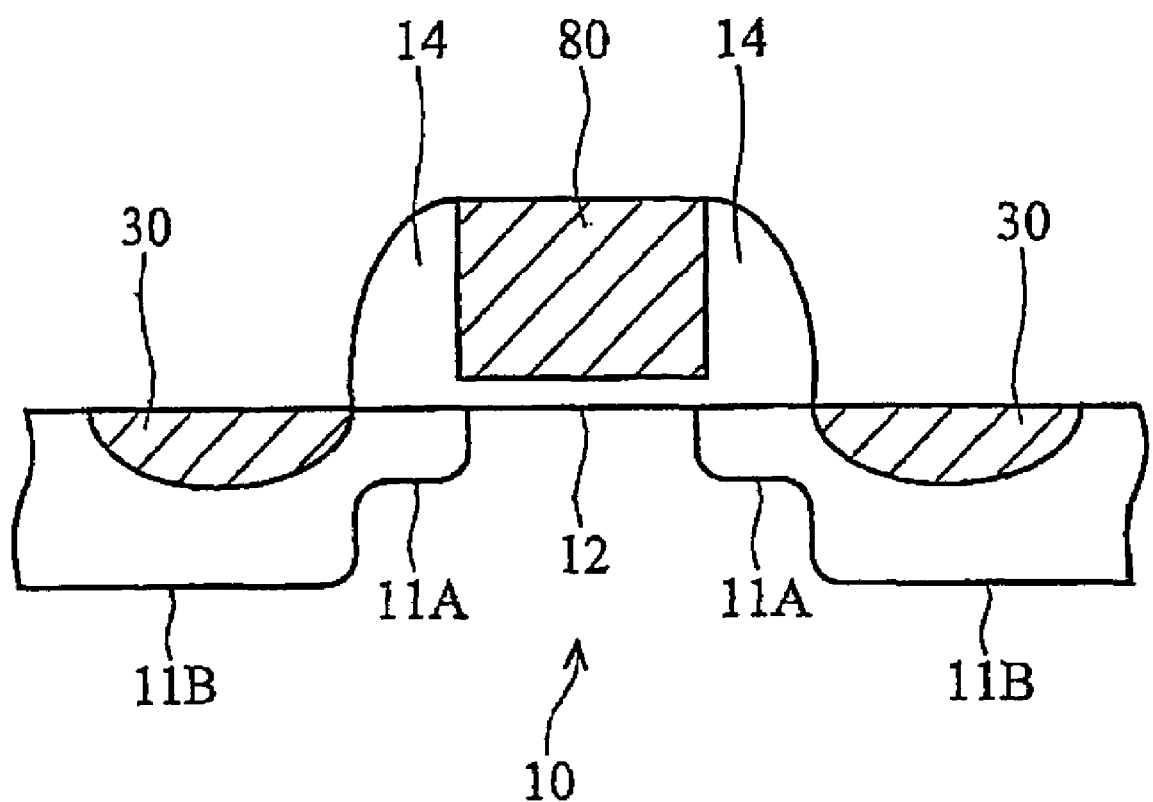

Referring to FIG. 11, the unreacted metal layer 81 and the shielding layer 50 are removed, thereby providing a fully silicidized gate electrode 80 and silicided source/drain regions 30. Etching may be performed, for example, in a two-step etching process. A wet chemical etch that is highly selective for unreacted metal relative to the silicide, such as previously described for nickel, is employed to remove the unreacted metal 81. The shield layer 50 may then be removed using conventional etching techniques suitable for removing that material relative to the spacers 14 and silicide regions, for example, phosphoric acid etching may be employed. Alternatively, a single etch that etches both the unreacted metal 81 and the shield layer 50 selectively relative to the silicide regions 80, 30 may be employed.

Referring again to FIG. 6, polymer layer 100 can be formed in several ways. In a first embodiment, a low viscosity polymer, such as an organic polymer comprising a 193 nm or 248 nm photoresist, is flowed over the substrate in a volume sufficient to form a layer 100 that cover the source/drain regions but not the top surface of the gate electrode. In one embodiment, the polymer is applied by spin coating and the thickness can be controlled by volume and spin speed. In a second embodiment, a polymer layer is deposited over the substrate in a thickness sufficient to cover both source/drain regions and the gate electrode. The polymer layer is then etched back to the desired thickness, exposing the shielding layer 50 over the gate electrode top surface. In one embodiment, the polymer layer comprises a 193 nm or 248 nm photoresist or other organic polymer that can be removed by a wet or dry sapping process, preferably an oxygen plasma etching. The layer is then etched back at a pressure between about 5–100 mTorr, power between about 50–1000 Watts, using a $O_2$ base with an additional etchant gas, such as HBr, $Cl_2$, He, or Argon at a temperature between about 20–100° C. In a third embodiment, layer 100 may be formed to the desired thickness through a baking and developing process. Generally, the organic polymer will react with the development solution at a high temperature, providing at least two parameters that can be used to control the polymer thickness—the amount of development solution and temperature.

In a possible alternative embodiment, only the silicide regions 30 are initially formed as shown in FIG. 3, leaving gate 30 initially unsilicided. This may be accomplished by selectively depositing metal layer 20 or using a shielding layer over gate 13 that is etched to expose the active regions, or, in one embodiment, using a removable "dummy" gate electrode during silicidation of the active regions. Subsequently, the process steps described above in connection with FIGS. 5–11 are employed, only metal layer 70 is deposited to a thickness sufficient to fully silicidize gate 13 upon annealing. This embodiment allows for the use of different metals in forming silicide regions 30 and 80 if desired.

The manufacturing process described herein is adaptable to manufacturing any of the various types of semiconductor devices, particularly advanced deep-submicron CMOS devices, such as 0.1 microns with ultra-shallow junctions, e.g., above 500 Å to about 2000 Å in depth, while significantly improving the reliability of ultra-shallow junctions. Parasitic, sheet and contact resistance between the active regions and the gate electrode and interconnects is achieved without increasing junction leakage current.

The method described herein also provides for excellent control of the gate electrode height during the silicidation process. The process has an improved process window for exposing the top surface of the gate electrode in a two-step silicidation formation process, thereby facilitating improved control of the silicidation process, which provides improved fully silicided gates, and consequent benefits thereof, such as lower gate electrode resistance, improved device speed, prevention or reduction of boron migration into the gate electrode and reduction or elimination of the depletion effect, without high junction leakage current or spiking.

As noted, the method provides for excellent control of the gate electrode height in forming increased silicidation in gate electrodes, particularly when compared to a process using a chemical mechanical polish as described above in the Background of the Invention section. Substantially uniform gate electrode heights can be achieved across regions in an integrated circuit. In a typical integrated circuit, there are both areas of dense lines and isolated lines (iso lines) within both active (OD) and shallow trench isolation (STI) regions. In one embodiment, the present method described above utilizes an etch process in exposing gates for silicidation. The etch process provides a substantially uniform etch rate with respect to both areas of dense and non-dense (e.g., isolated) patterns with these regions. Conversely, CMP polishing rates tend to depend on pattern density, thereby providing different polishing rates for areas of dense and less dense patterning within both OD and STI regions. In one embodiment, the gate height difference between gates in dense and less dense or non-dense areas in the OD and/or STI regions is less than 10%. In this embodiment, at least some, if not all, of the gates in these regions are fully silicided.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method of forming a silicided gate on a substrate having active regions, comprising the steps of:

forming suicide in the active regions and a portion of the gate, leaving a remaining portion of the gate unsilicided;

forming a shielding layer over the active regions and gate after said silicide forming step;

forming a coating layer over portions of the shielding layer over the active regions;

opening said shielding layer to expose said gate, wherein said coating layer protects said portions of said shielding layer over said active regions during said opening step;

depositing a metal layer over the exposed gate; and annealing to cause the metal to react with the gate to silicidize at least a part of the remaining portion of the gate, wherein said coating layer comprises a polymer, and wherein the step of forming said coating layer comprises the step of depositing said polymer to a thickness less than the height of said gate, wherein said shielding layer is exposed over a top surface of said gate.

2. The method of claim 1, further comprising the step of removing said coating layer after said opening step and before said metal depositing step,
   wherein the shielding material prevents said metal from reacting with the active regions during said annealing step.

3. The method of claim 2, wherein said removing step comprises an oxygen plasma ashing process.

4. The method of claim 1, wherein said metal layer depositing step comprises depositing said metal layer over the gate a sufficient thickness to fully silicidize the remaining portion of the gate upon annealing.

5. The method of claim 1, wherein the height of the gate is between about 500–2800 Å.

6. The method of claim 1, wherein said metal is selected from the group consisting of Ni, Co, Pd, Ti and Cr.

7. The method of claim 1, wherein said opening step comprises an etching process.

8. The method of claim 1, wherein said annealing step comprises annealing to cause the metal to react with the gate to silicidize the remaining portion of the gate, whereby a fully silicided gate is formed.

9. A method of forming a fully silicided gate on a substrate having active regions, comprising the steps of:
   forming silicide in the active regions and a portion of the gate, leaving a remaining portion of the gate unsilicided;
   forming a shielding layer over the active regions and gate after said silicide forming step;
   forming a polymer coating over the shielding layer over the active regions to a thickness less than the height of said gate;
   etching said shielding layer to expose a top surface of said gate, wherein said polymer coating protects portions of said shielding layer over said active regions from said etching step;
   after said etching step, removing said polymer coating over said active regions,
   depositing a metal layer over the top surface of said gate; and
   annealing to cause the metal to react with the gate to silicidize the remaining portion of the gate, wherein said shielding layer prevents said metal from reacting with the active regions during the annealing, whereby a fully silicided gate is formed.

10. The method of claim 9, wherein said polymer coating comprises an organic polymer and said removing step comprising an oxygen plasma ashing process.

11. The method of claim 9, wherein said metal layer deposition step comprises depositing said metal layer over the gate a sufficient thickness to fully silicidize the remaining portion of said gate.

12. The method of claim 9, wherein the height of the gate is between about 1000–2000 Å.

13. The method of claim 9, wherein said metal is selected from the group consisting of Ni, Co, Pd, Ti and Cr.

14. The method of claim 9, wherein said polymer comprises an organic polymer and the step of forming said coating layer comprises depositing said polymer to a thickness less than the height of said gate, wherein said shielding layer is exposed over a top surface of said gate.

15. The method of claim 9, wherein the polymer comprises an organic polymer and wherein the step of forming said coating layer comprises:
   depositing said polymer over said substrate to a thickness sufficient to cover said gate; and
   etching said deposited photoresist to a thickness less than the height of said gate, wherein said shielding layer is exposed over a top surface of the gate electrode.

16. The method of claim 9, wherein said polymer comprises a photoresist and the step of forming said coating layer comprises:
   depositing said photoresist and developing said photoresist to a thickness less than the height of said gate, wherein said shielding layer is exposed over a top surface of the gate electrode.

17. A method of forming a silicided gate on a substrate having active regions, comprising the steps of:
   forming silicide in the active regions and a portion of the gate, leaving a remaining portion of the gate unsilicided;
   forming a shielding layer over the active regions and gate after said silicide forming step;
   forming a coating layer over portions of the shielding layer over the active regions;
   opening said shielding layer to expose said gate, wherein said coating layer protects said portions of said shielding layer over said active regions during said opening step;
   depositing a metal layer over the exposed gate; and
   annealing to cause the metal to react with the gate to silicidize at least a part of the remaining portion of the gate,
   wherein said coating layer comprises a polymer, and
   wherein the step of forming said coating layer comprises:
      depositing said polymer over said substrate to a thickness sufficient to cover said gate; and
      etching said deposited polymer to a thickness less than the height of said gate, wherein said shielding layer is exposed over a top surface of the gate electrode.

18. A method of forming a silicided gate on a substrate having active regions, comprising the steps of:
   forming silicide in the active regions and a portion of the gate, leaving a remaining portion of the gate unsilicided;
   forming a shielding layer over the active regions and gate after said silicide forming step;
   forming a coating layer over portions of the shielding layer over the active regions;
   opening said shielding layer to expose said gate, wherein said coating layer protects said portions of said shielding layer over said active regions during said opening step;
   depositing a metal layer over the exposed gate; and
   annealing to cause the metal to react with the gate to silicidize at least a part of the remaining portion of the gate,
   wherein said coating layer comprises a polymer, and
   wherein said polymer comprises a photoresist and the step of forming said coating layer comprises:
      depositing said photoresist and developing said photoresist to a thickness less than the height of said gate, wherein said shielding layer is exposed over a top surface of the gate electrode.

* * * * *

UNITED STATES PATENT AND TRADEMARK OFFICE
CERTIFICATE OF CORRECTION

| | |
|---|---|
| PATENT NO. | : 7,241,674 B2 |
| APPLICATION NO. | : 10/846278 |
| DATED | : July 10, 2007 |
| INVENTOR(S) | : Bor-Wen Chan; Jyu-Horng Shieh and Hun-Jan Tao |

It is certified that error appears in the above-identified patent and that said Letters Patent is hereby corrected as shown below:

Column 5, Line 4, delete "suicides" and insert therefore -- silicides --.

Column 6, Line 47, delete "suicide" and insert therefore -- silicide --.

Signed and Sealed this

Fourth Day of December, 2007

JON W. DUDAS
*Director of the United States Patent and Trademark Office*